United States Patent
Huang et al.

(10) Patent No.: US 6,750,673 B1
(45) Date of Patent: Jun. 15, 2004

(54) METHOD FOR MEASURING AN EFFECTIVE CHANNEL LENGTH OF A MOSFET

(75) Inventors: Heng-Sheng Huang, Taipei (TW); Gary Hong, Hsin-Chu (TW); Shih-Chieh Lin, Taipei Hsien (TW); Yueh-Hsun Lee, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/249,443

(22) Filed: Apr. 10, 2003

(51) Int. Cl.[7] .............................................. G01R 31/26
(52) U.S. Cl. ....................................... 324/769; 324/765
(58) Field of Search ................................. 324/765–769, 324/73.1, 158.1; 257/40, 48

(56) References Cited

U.S. PATENT DOCUMENTS 5,652,445 A * 7/1997 Johnson ....................... 324/252
5,821,766 A * 10/1998 Kim et al. .................... 324/769
6,111,423 A * 8/2000 Imoto ........................... 324/769
6,617,873 B2 * 9/2003 Yokomizo .................... 324/769
6,646,462 B1 * 11/2003 Yang et al. ................... 324/769

* cited by examiner

Primary Examiner—David A. Zarneke
Assistant Examiner—Jermele M. Hollington
(74) Attorney, Agent, or Firm—Winston Hsu

(57) ABSTRACT

A first compensation factor, a second compensation factor and a third compensation factor are provided to improve a capacitance-voltage (C-V) method for measuring an effective channel length of a metal-oxide-semiconductor field effect transistor (MOSFET), and an overlap length of a gate and a source and a drain of the transistor. The first compensation factor is calculated by measuring two unit length gate capacitances of the transistor. The second compensation factor is calculated by measuring two unit length overlap capacitances of the transistor. The third compensation factor is a ratio of the second compensation factor to the first compensation factor.

17 Claims, 6 Drawing Sheets

$$L_{effective} = L_{mask} - \Delta L \quad (um) \quad (101)$$

$$\Delta L = L_{bias} + 2L_{overlap} \quad (um) \quad (102)$$

$$C_{inversion} = C_{gate} + 2C_{fringing} + (C_{offset}/W) \quad (pF/um) \quad (103)$$

$$C_{accumulation} = C_{overlap} + 2C_{fringing} + (C_{offset}/W) \quad (pF/um) \quad (104)$$

$$\theta'' = C_{gate}(Vg=Vcc)/C_{gate}(Vg=0) \quad (105)$$

$$\theta' = C_{overlap}(Vg=-Vcc)/C_{overlap}(Vg=0) \quad (106)$$

$$\theta = \frac{\theta'}{\theta''} \quad (107)$$

$$L_{overlap} = \frac{L_{overlap,eff}}{\theta} \quad (um) \quad (108)$$

$$L_{overlap,eff} = \frac{C_{overlap}}{C_{ox}} \quad (um) \quad (109)$$

$$L_{bias} = L_{mask} - L_{gate} \quad (um) \quad (110)$$

Fig. 6

METHOD FOR MEASURING AN EFFECTIVE CHANNEL LENGTH OF A MOSFET

BACKGROUND OF INVENTION

1. Field of the Invention

The present invention relates to a method for measuring an effective channel length of a metal-oxide-semiconductor field effect transistor (MOSFET), and more particularly, to a method for measuring the effective channel length of the MOSFET and by using three compensation factors to accuratelydetermine positions of a drain and a source of the MOSFET.

2. Description of the Prior Art

Measuring the value of an effective channel length ($L_{effective}$) has always been one of the most important issues in the semiconductor industry to infer the characteristics of the MOSFET correctly. Furthermore, the effective channel length of the MOSFET is also one of the most important references for computer aided designing (CAD).

Please refer to FIG. 1 of a cross-sectional diagram of a metal-oxide-semiconductor field effect transistor (MOSFET) 10. The transistor 10 at least comprises a gate 12, a source 14, a drain 16 and a silicon substrate 18. Wherein an effective channel length of the transistor 10 is defined as the length of a channel 22 between the source 14 and the drain 16. The value of a threshold voltage $V_T$ of the transistor 10 is depended on the kind of the transistor 10, i.e., NMOS and PMOS etc. As the silicon substrate 18 and the source 14 are both grounded and a voltage greater than the threshold voltage $V_T$ of the transistor 10 is applied to the gate 12 of the transistor 10, the channel 22 is formed between the source 14 and the drain 16. In this case, a 0 volts voltage is applied to the source 14. Moreover, if and only if the voltage applied to the gate 12 is less than the threshold voltage $V_T$ of the transistor 10, the channel 22 vanishes, and the transistor 10 is in a cutoff mode and becomes non-conductive.

Normally, the method for measuring the effective channel length $L_{effective}$ according to prior art regards the carrier mobility in the channel 22 as a constant for a group of devices with various channel lengths, or further simplified the carrier mobility in the channel 22 as a gate-bias-independent constant based on the assumption that the potential of the gate 12 is with a fixed value. However, this is not consistent with the reality that the Inversion carrier mobility Is determined by gate overdrive $V_{GT}$, which is equal to the difference between the voltage of the gate $V_{GS}$ and the threshold voltage of the transistor $V_T$, i.e.,$V_{GT}=V_{GS}-v_T$. Some techniques are thus proposed to obtain the effective channel length of the transistor more accurately by using the fixed gate overdrive $V_{GT}$ instead of the fixed gate bias. However, the bias dependence of the drain-and-source series resistance is not taken into account. In the conventional I-V (current-voltage) approach, a channel length loss $\Delta L$ and a series resistance $R_{DS}$ are needed to be extracted simultaneously and the $R_{DS}$ is assumed bias-independent so as to derive $\Delta L$ from the linear I-V equation. Unfortunately, the $R_{DS}$ is not bias-independent in fact, so that the accuracy of the $\Delta L$ obtained is flawed.

Please refer to FIG. 2 of the cross-sectional diagram of the MOSFET 10 shown in the FIG. 1 with a corresponding photomask 20. The photomask 20 is used for forming the gate 12 of the transistor 10 by lithography and etching processes during the manufacturing of the transistor 10. Wherein both the source 14 and the drain 16 are formed by performing ion implantation processes. During the lithography and etching processes, a polysilicon gate lithography bias $L_{bias}$ is formed between the photomask 20 and the gate 12 so that a length of the photomask $L_{mask}$ is not equal to a length of the gate $L_{gate}$. For simplicity of description, the length of the photomask 20 is assumed to be greater than the length of the gate 12 in FIG. 2. However, the length of the photomask $L_{mask}$ is occasionally less than the length of the gate $L_{gate}$ during different manufacturing processes. Alternatively, a metallurgical channel 23, the length of the metallurgical channel 23 being defined as the distance between the source 14 and the drain 16,exists in the transistor 10. Normally the effective channel length $L_{effective}$ is greater than the length of the metallurgical channel 23.

The method for measuring the effective channel length of the transistor 10 according to the prior art is by way of measuring the voltage and the current between the source 14 and the drain 16. FIG.2 represents a current-voltage (I-V) approach method for measuring the effective channel length. By using the flowing equation below, the effective channel equivalent resistance $R_{channel}$ of the transistor 10 is obtained:

$$R^{channel} = \frac{L_{effective}}{\mu_{eff} C_{ox} W (V_{gate} - V_t)} = \frac{V_{ds}}{I_{ds}} \quad (1)$$

wherein $\mu_{eff}$ is the effective mobility of the inversion carries;

$C^{ox}$ is the gate oxide capacitance per unit area;

W is the width of the transistor 10:

$V^{gate}$ is the voltage applied to the gate 12;

$V^t$ is the threshold voltage of the transistor 10;

$V^{ds}$ is the voltage between the source 14 and the drain 16; and $I^{ds}$ is the current flows from the source 14 to the drain 16.

After the effective channel length $L_{effective}$ is measured, the effective channel equivalent resistance $R_{channel}$ is capable of be calculated according to the equation (1), and the one-dimension model of the transistor 10 can be established thereafter. However, the method is merely capable of measuring the effective channel length $L_{effective}$ of the transistor 10 and cannot be applied to measure the polysilicon gate lithography bias $L_{bias}$, and the overlap length $2L_{overlap}$ of the gate 12 and the source/drain 14/16. Consequently, the correct junction position of the source/drain 14/16 is not capable of being determined.

SUMMARY OF INVENTION

It is therefore a primary objective of the present invention to provide a method for measuring an effective channel length, a polysilicon gate lithography bias $L_{bias}$, and an overlap length of a gate and a source/drain $2L_{overlap}$.

According to the claimed invention, a metal-oxide-semiconductor field effect transistor (MOSFET) has a silicon substrate, a gate, a drain, and a source. As the silicon substrate and the source are both grounded and a voltage greater than a threshold voltage of the transistor is applied to the gate of the transistor, a channel is formed between the drain and the source, and the transistor is operated in either an inversion mode or an accumulation mode. The method of measuring an effective channel length of the transistor comprising:

a. measuring a first unit length gate capacitance as the transistor is in the inversion mode, measuring a second unit length gate capacitance as the gate is grounded, and calculating a first compensation factor according to both the first unit length gate capacitance and the second unit length gate capacitance, wherein the first compensation factor is equal to a ratio of the first unit length gate capacitance to the second unit length gate capacitance;

b. measuring a first unit length overlap capacitance between the gate and the source/drain as the transistor is in the accumulation mode, measuring a second unit length overlap capacitance between the gate and the source/drain as the gate is grounded, and calculating a second compensation factor according to the first unit length overlap capacitance and the second unit length overlap capacitance, wherein the second compensation factor is equal to a ratio of the first unit length overlap capacitance to the second unit length overlap capacitance;

c. calculating a third compensation factor, the third compensation factor being equal to a ratio of the second compensation factor to the first compensation factor; and d. calculating the effective channel length and an overlap length of the gate and the source/drain according to the first, second and third compensation factors.

It is an advantage of the present invention that not only the effective channel length is capable of be measured, but also the correct position of the source and the drain is capable of be determined.

This and other objectives of the present invention will no doubt become obvious to those of ordinary skill in the art after reading the following detailed description of the preferred embodiment, which is illustrated in the various figures and drawings.

BRIEF DESCRIPTION OF DRAWINGS

FIG. 6 lists the equations in the present invention.

detailed description

Figure 1:
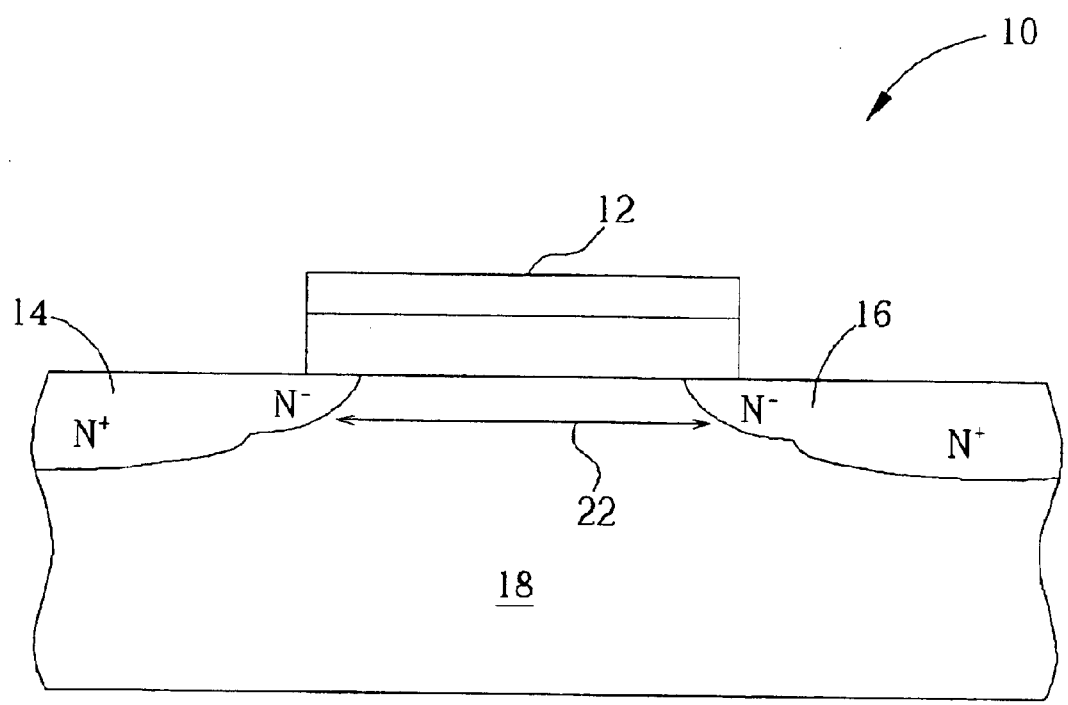
FIG. 1 is a cross-sectional diagram of a metal-oxide-semiconductor field effect transistor.
Figure 2:
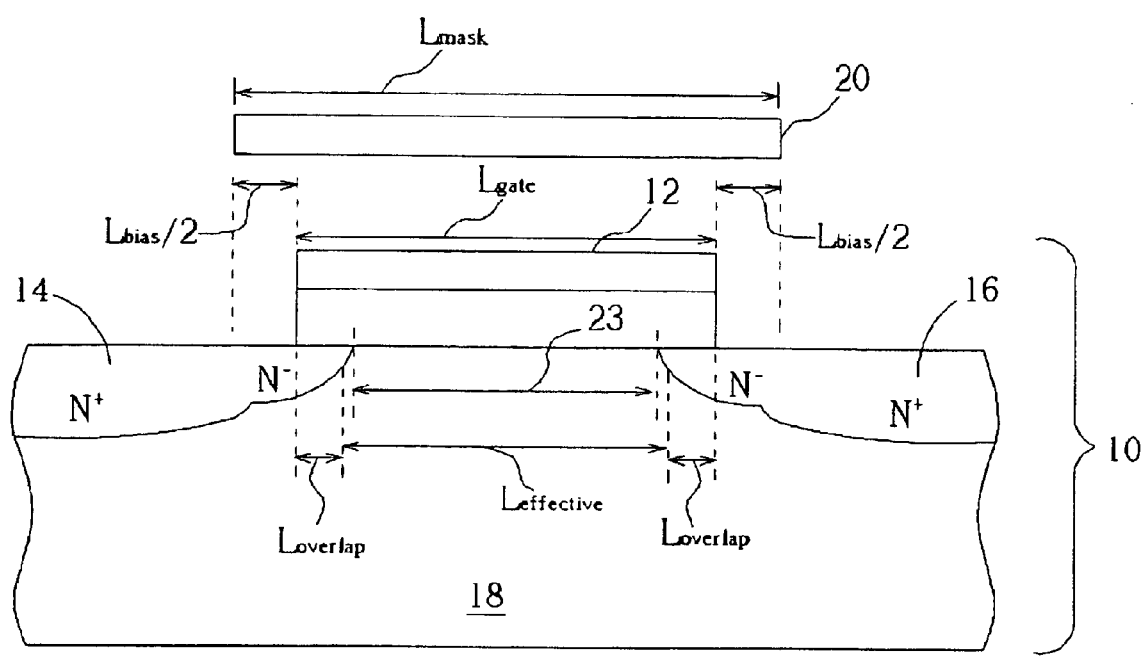
FIG. 2 is the cross-sectional diagram of the transistor shown in the FIG. 1 with a corresponding photomask.
Figure 3:
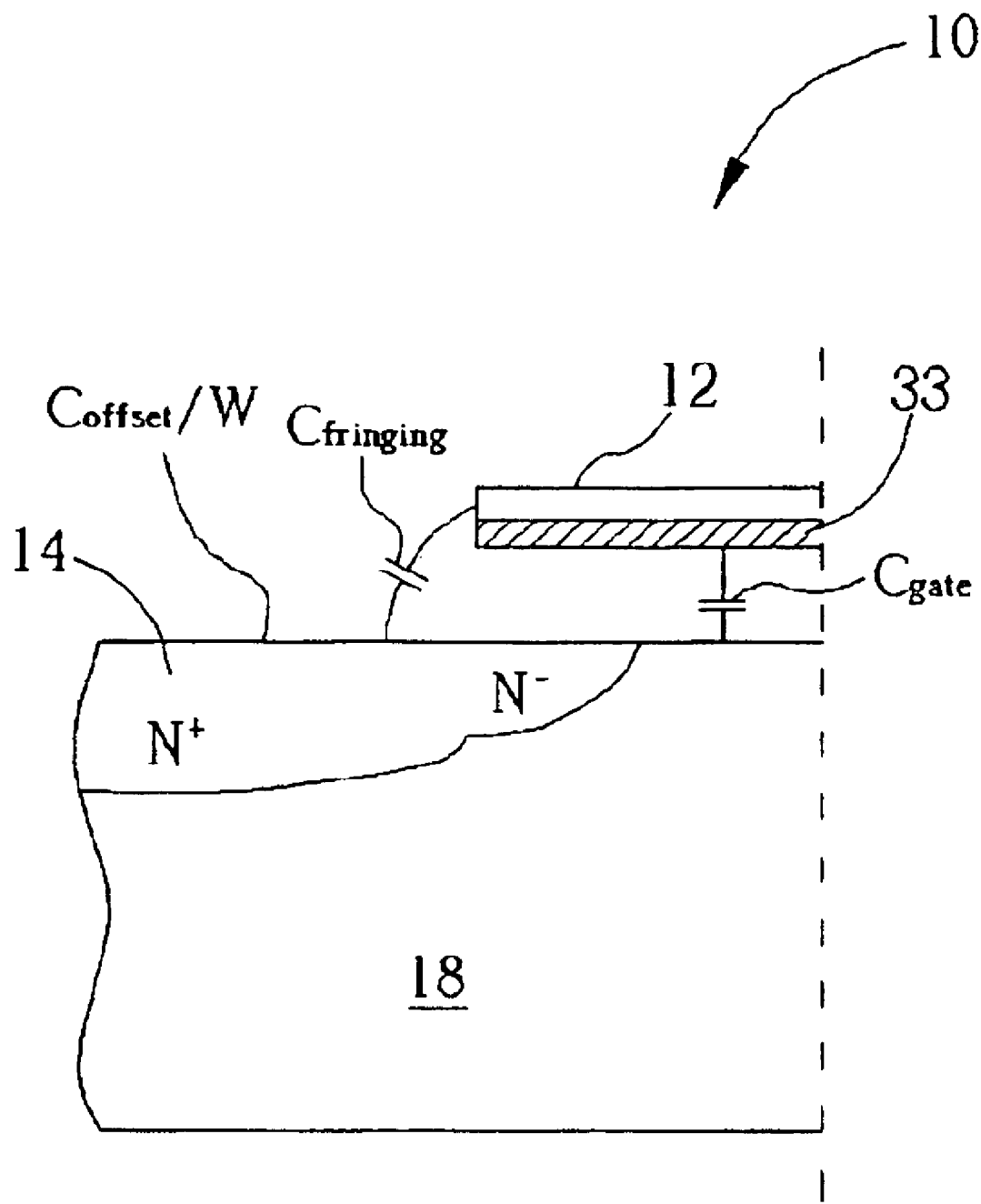
FIG. 3 is the cross-sectional and equivalent capacitance circuit diagram of the transistor shown in the FIG. 1 when the transistor is in the inversion mode.

Please refer to FIG. 2 and FIG. 3. FIG. 3 is a cross-sectional and equivalent capacitance circuit diagram of the transistor 10 shown in the FIG. 1 as in an inversion mode. In the preferred embodiment of the present invention, the MOSFET 10 is a N-type MOS. For simplicity of description, only the left-half part of the transistor 10, comprising a source 14, is shown in FIG. 3 and a subsequent FIG. 4. As previously mentioned, the transistor 10 comprises a gate 12, the source 14, and a silicon substrate 18. As the transistor 10 is in the inversion mode, the source 14 and the substrate 18 are grounded, and a positive voltage greater than a threshold voltage $V_T$ is applied to the gate 12 so that a channel 22 is formed between the source 14 and the drain 16, and a depletion region 33 is formed at the gate 12. Wherein the equivalent unit length capacitance of the transistor $C_{inversion}$ is a sum of the unit length gate capacitance $C_{gate}$ of the transistor 10, the unit length fringing capacitance of the gate $2C_{fringing}$, and a unit length offset capacitance $C_{offset}/W$ of the transistor 10, and is expressed as the equation below:

$$C_{inversion} = C_{gate} + 2C_{fringing} + C_{offset}/W$$

Wherein the W is the transistor 10 width.

Figure 4:
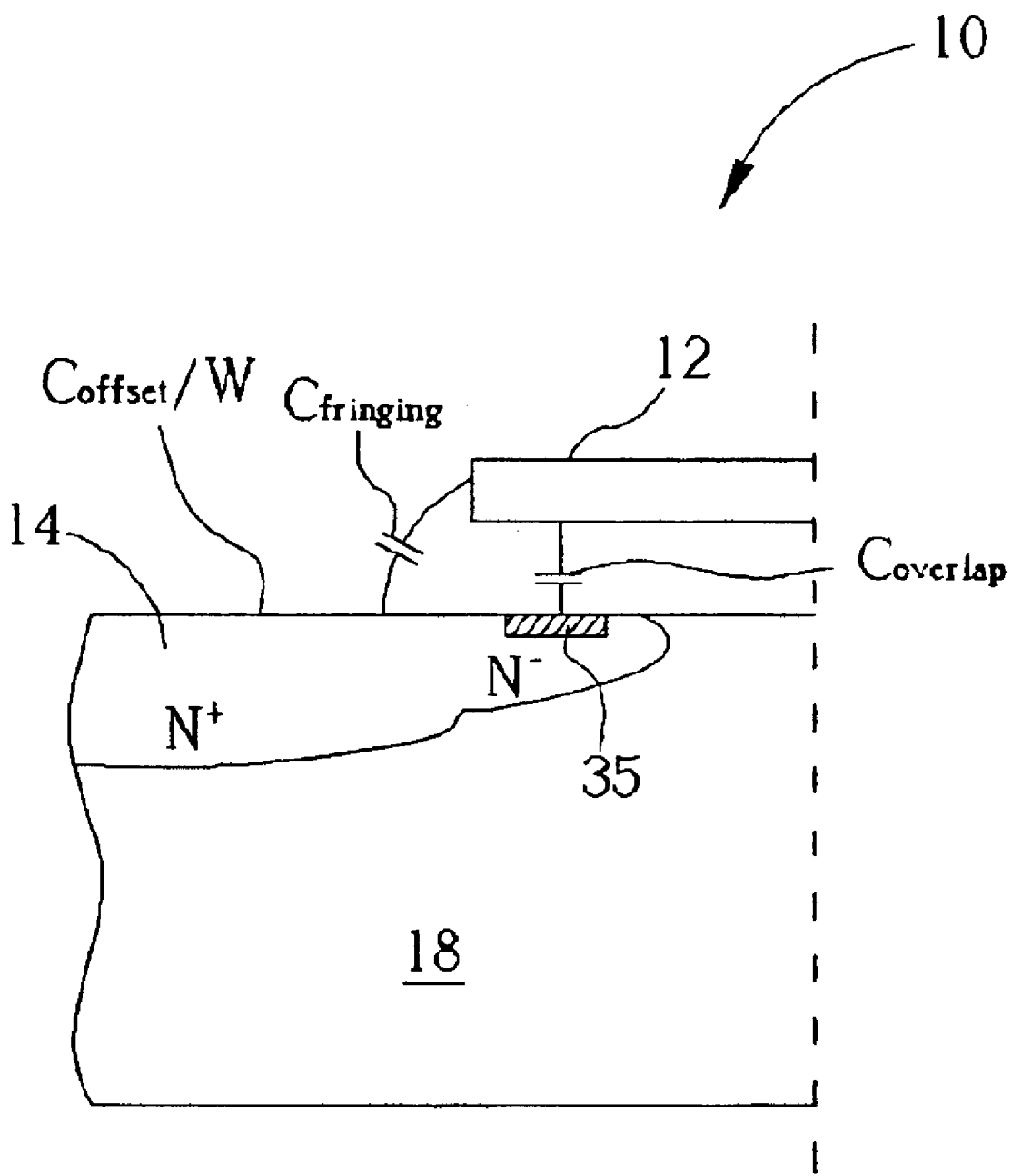
FIG. 4 is the cross-sectional and equivalent capacitance circuit diagram of the transistor shown in the FIG. 1 when the transistor is in the accumulation mode.

Please refer to FIG. 4 of the cross-sectional and equivalent capacitance diagram of the transistor 10 shown in the FIG. 1 as in an accumulation mode. As the transistor 10 is in the accumulation mode, the source 14 and the substrate 18 are grounded, and a negative voltage is applied to the gate 12. This causes the junction of the source 14 of the transistor 10 to extend rightward, and another depletion region 35 is thus formed under the gate 12 and in the source 14. Therefore, the equivalent unit length capacitance of the transistor $C_{accumulation}$, expressed as the equation below, is the sum of a unit length overlap capacitance $C_{overlap}$ between the gate 12 and the source/drain 14/16, the unit length fringing capacitance of the gate $2C_{fringing}$, and the unit length offset capacitance $C_{offset}/W$. $C_{accumulation} = C_{overlap} + 2C_{fringing} + C_{offset}/W$.

In addition, the effective overlap length $L_{overlap,eff}$ of the gate 12 and the source/drain 14/16 is a ratio of the unit length overlap capacitance $C_{overlap}$ to the unit area gate oxide capacitance of the transistor $C_{ox}$, and is expressed as the equation below.

$$L_{overlap,eff} = C_{overlap}/C^{ox}$$

As mentioned in preceding paragraphs, as the transistor 10 is in the inversion mode, the depletion region 33 is formed at the gate 12; as the transistor 10 is in the accumulation mode, the depletion region 35 is formed under the gate 12 and in the source 14, and the junction of the source/drain 14/16 extends horizontally. A first compensation factor $\theta''''$ and a second compensation factor $\theta''$ are thus provided in the present invention to calculate the correct effective channel length $L_{effective}$ and the polysilicon gate lithography bias $L_{bias}$. The first compensation factor $\theta''''$ is measured as the transistor 10 is in the inversion mode, and the second compensation factor $\theta''$ is measured when the transistor 10 is in the accumulation mode. In order to calculate the first compensation factor $\theta''''$, a first unit length gate capacitance $C_{gate}$ (Vg=Vcc) and a second unit length gate capacitance $C_{gate}$ (Vg=0) are measured in advance. The first unit length gate capacitance $C_{gate}$ (Vg=Vcc) is the unit length gate capacitance $C_{gate}$ of the transistor 10 as the transistor 10 is in the inversion mode and a positive voltage Vcc is applied to the gate 12, And the second unit length gate capacitance $C_{gate}$ (Vg=0) is the unit length gate capacitance $C_{gate}$ of the transistor 10 as the gate 12 is grounded. The first compensation factor $\theta''''$ is equal to the ratio of the first unit length gate capacitance $C_{gate}$ (Vg=Vcc) to the second unit length gate capacitance $C_{gate}$ (Vg=0), and is expressed as the equation below:

$$\theta'' = C_{gate}(Vg=-Vcc)/C_{gate}(Vg=0).$$

Before calculating the second compensation factor $\theta''$, a first unit length overlap capacitance $C_{overlap}$ (Vg=−Vcc) and a second unit length overlap capacitance $C_{overlap}$ (Vg=0) are measured in advance. The first unit length overlap capacitance $C_{overlap}$ (Vg=−Vcc) is the unit length overlap capacitance $C_{overlap}$ of the transistor 10 as the transistor 10 is in the accumulation mode and a negative voltage −Vcc is applied to the gate 12, and the second unit length overlap capacitance $C_{overlap}$ (Vg=0) is the unit length overlap capacitance $C_{overlap}$ of the transistor 10 as the gate 12 is grounded. The second compensation factor θ" is equal to the ratio of the first unit length overlap capacitance $C_{overlap}$ (Vg=-Vcc) to the second unit length overlap capacitance $C_{overlap}$ (Vg=0), and is expressed as the equation below:

θ'=$C_{overlap}$ (Vg=-Vcc)/$C_{overlap}$ (Vg=0).

The present invention further provides a third compensation factor θ according to the first compensation factor θ"" and the second compensation factor θ". The third compensation factor θ is equal to the ratio of the second compensation factor θ" to the first compensation factor θ"", i.e. θ=θ"/θ"". Therefore, among the three compensation factors θ"", θ", and θ, the third compensation factor θ is calculated last. Since the overlap length $L_{overlap}$ of the gate 12 and the source/drain 14/16 is the ratio of the effective overlap length $L_{overlap,eff}$ to the third compensation factor θ, i.e., $L_{overlap}$=$L_{overlap,eff}$/θ, the overlap length $L_{overlap}$ is capable of being calculated. Furthermore, the effective overlap length $L_{overlap,eff}$ is the ratio of the unit length overlap capacitance $C_{overlap}$ to the unit area gate oxide capacitance of the transistor $C^{ox}$, i.e., $L_{overlap,eff}$=$C_{overlap}$/$C^{ox}$, so that the unit length overlap capacitance $C_{overlap}$ is capable of being calculated after the calculation of the overlap length $L_{overlap}$. In addition, the unit length fringing capacitance of the gate 2$C_{fringing}$ and the unit length offset capacitance $C_{offset}$/W of the transistor 10 are capable of be measured by using on present measuring technology, so the equivalent unit length capacitance of the transistor $C_{accumulation}$ can be calculated.

Figure 5:
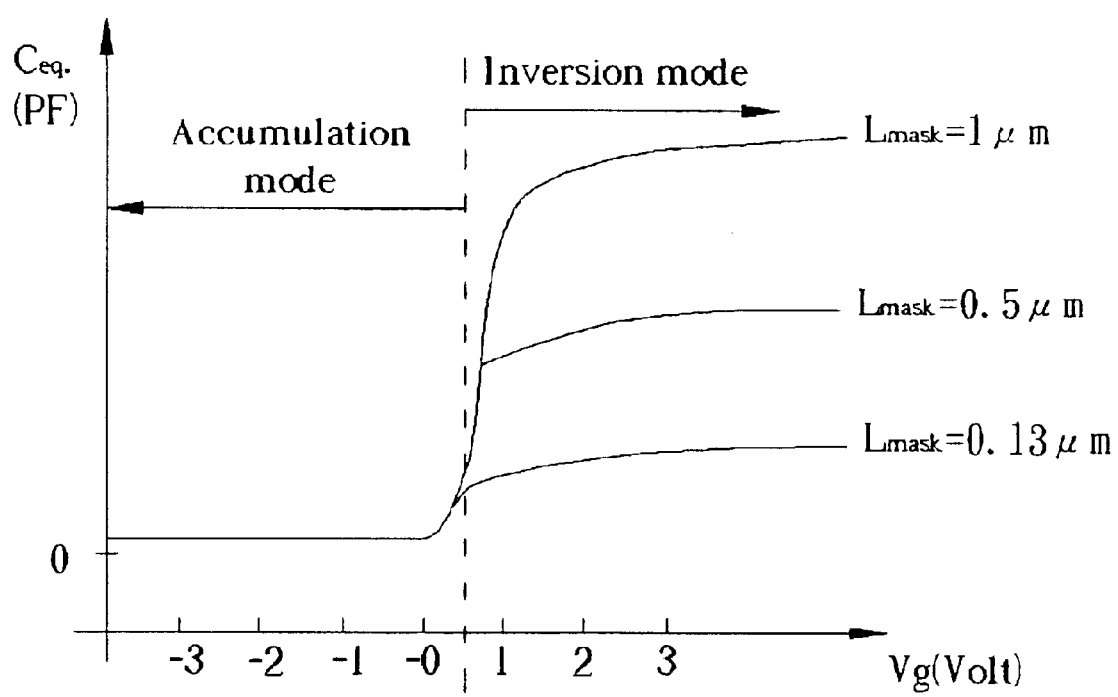
FIG. 5 represents a relationship between a gate voltage and equivalent unit length capacitances of different MOSFET devices with the same gate length and various photomask lengths.

Please refer to FIG. 5. FIG. 5 represents a relationship between a gate voltage Vg and the equivalent unit length capacitances $C_{inversion}$ of different MOSFET devices with the same gate length $L_{gate}$ and various photomask lengths $L_{mask}$. Since the equivalent unit length capacitances $C_{inversion}$ are capable of being measured as the MOSFET devices are in the inversion mode, and the equivalent unit length capacitance $C_{inversion}$ is the sum of the unit length gate capacitance $C_{gate}$, the unit length fringing capacitance of the gate 2$C_{fringing}$, and a unit length offset capacitance $C_{offset}$/W, i.e., $C_{inversion}$=$C_{gate}$+2$C_{fringing}$+$C_{offset}$/W, the unit length gate capacitances $C_{gate}$ of different MOSFET devices can be calculated. With the help of the previously mentioned C-V (capacitance-voltage) curves, the length of the gate $L_{gate}$ is extracted by using the flowing equation:

$$L^{gate} = \frac{C_{gate}(L_{ref1} - L_{ref2})}{C_{inversion1} - C_{inversion2}}$$

wherein $L_{ref1}$ and $L_{ref2}$ are the photomask lengths $L_{mask}$ of two corresponding MOSFET devices, and $C_{inversion1}$ and $C_{inversion2}$ are the equivalent unit length capacitance $C_{inversion}$ of the two corresponding MOSFET devices.

Therefore, after calculating the length of the gate $L_{gate}$ the polysilicon gate lithography bias $L_{bias}$ and the effective channel length $L_{effective}$ are capable of be calculated.

Please refer to FIG. 2 to FIG. 6. FIG. 6 lists the equations in the present invention. The equation (101) indicates that the effective channel length $L_{effective}$ is equal to the difference between the length of the photomask $L_{mask}$ and a predetermined length ΔL. As shown in FIG. 2, the sum of the effective channel length $L_{effective}$, the polysilicon gate lithography bias $L_{bias}$, and the overlap length of the gate and the source/drain 2$L_{overlap}$ is equal to the length of the photomask $L_{mask}$. The predetermined length ΔL is thus equal to the sum of the polysilicon gate lithography bias $L_{bias}$ and the overlap length 2$L_{overlap}$ of the gate 12 and the source/drain 14/16, as given by equation (102). The equation (103) is used for indicating the equivalent unit length capacitance of the transistor $C_{inversion}$ as the transistor 10 is in the inversion mode. As previously mentioned, the equivalent unit length capacitance of the transistor $C_{inversion}$ is the sum of the unit length gate capacitance $C_{gate}$ of the transistor 10, the unit length fringing capacitance of the gate 2$C_{fringing}$, and the unit length offset capacitance $C_{offset}$/W of the transistor 10. The equation (104) is used for indicating the equivalent unit length capacitance of the transistor $C_{accumulation}$ as the transistor 10 is in the accumulation mode. As previously mentioned, the equivalent unit length capacitance of the transistor $C_{accumulation}$ is the sum of the unit length overlap capacitance $C_{overlap}$ between the gate 12 and the source/drain 14/16, the unit length fringing capacitance of the gate 2$C_{fringing}$, and the unit length offset capacitance $C_{offset}$/W. Equations (105) and (106) indicate methods of calculating the first compensation factor θ"" and the second compensation factor θ, respectively. Equation (107) Indicates that the third compensation factor θ is equal to the ratio of the second compensation factor θ" to the first compensation factor θ"". After calculating the third compensation factor θ, the effective overlap length of the gate and the source/drain $L_{overlap,eff}$, and unit length overlap capacitance $C_{overlap}$ between the gate 12 and the source/drain 14/16 are both capable of being calculated according to the equations (108) and (109). Finally, the unit length gate capacitances C of different transistors with the same gate length $L_{gate}$ and various photomask lengths $L_{mask}$ an be calculated according the equation (103). By using the equation (110), the polysilicon gate lithography bias $L_{bias}$ is obtained by subtracting the length of the gate $L_{gate}$ from the length of the photomask $L_{mask}$. Consequently, the effective channel length $L_{effective}$, the overlap length of the gate and the source/drain 2$L_{overlap}$ and the polysilicon gate lithography bias $L_{bias}$ are capable of be calculated so that both the positions of the drain 14 and the source 16 of the transistor 10 can be determined.

In comparison with the prior art, the present invention provides an improved capacitance-voltage (C-V) method not only for calculating the effective channel length $L_{effective}$ of a MOSFET, but also for determining the correct positions of the junctions of the drain and the source. By calculating three compensation factors, the characteristics of the MOSFET are capable of be analyzedmore detailed.

Those skilled in the art will readily observe that numerous modifications and alterations of the device may be made while retaining the teachings of the invention. Accordingly, the above disclosure should be construed as limited only by the metes and sounds of the appended claims.

What is claimed is:

1. A method for measuring an effective channel length of a metal-oxide-semiconductor field effect transistor (MOSFET), the transistor comprising a silicon substrate, a gate, a drain, and a source; wherein when the silicon substrate and the source are both grounded and a voltage greater than a threshold voltage of the transistor is applied to the gate of the transistor, a channel is formed between the drain and the source, the transistor being in one of either an inversion mode or an accumulation mode, the method comprising:

measuring a first unit length gate capacitance when the transistor is in the inversion mode, measuring a second unit length gate capacitance when the gate is grounded, and calculating a first compensation factor according to the first unit length gate capacitance and the second unit length gate capacitance, wherein the first compensation factor is equal to a ratio of the first unit length gate capacitance to the second unit length gate capacitance;

measuring a first unit length overlap capacitance between the gate and the source and the drain when the transistor is in the accumulation mode, measuring a second unit length overlap capacitance between the gate and the source and the drain when the gate is grounded, and calculating a second compensation factor according to the first unit length overlap capacitance and the second unit length overlap capacitance, wherein the second compensation factor is equal to a ratio of the first unit length overlap capacitance to the second unit length overlap capacitance;

calculating a third compensation factor according to the first compensation factor and the second compensation factor, wherein the third compensation factor is equal to a ratio of the second compensation factor to the first compensation factor; and calculating the effective channel length and an overlap length of the gate and the source and the drain according to the first compensation factor, the second compensation factor, and the third compensation factor.

2. The method of claim 1 wherein when the transistor is in the inversion mode, an equivalent unit length capacitance of the transistor is a sum of a unit length gate capacitance, a unit length fringing capacitance of the gate, and a unit length offset capacitance.

3. The method of claim 1 wherein when the transistor is in the accumulation mode, an equivalent unit length capacitance of the transistor is a sum of a unit length overlap capacitance between the gate and the source and the drain, a unit length fringing capacitance of the gate, and a unit length offset capacitance.

4. The method of claim 3 wherein an effective overlap length of the gate and the source and the drain is a ratio of the unit length overlap capacitance to a unit area gate oxide capacitance of the transistor.

5. The method of claim 4 wherein an overlap length of the gate and the source and the drain is a ratio of the effective overlap length to the third compensation factor.

6. The method of claim 5 wherein the effective channel length is equal to a difference between a length of a photomask that is used for manufacturing the transistor, and a predetermined length that is equal to a sum of a polysilicon gate lithography bias and the overlap length of the gate and the source and the drain.

7. The method of claim 6 wherein the polysilicon gate lithography bias is equal to a difference between the length of the photomask and a length of the gate.

8. A method for measuring an effective channel length of a metal-oxide-semiconductor field effect transistor (MOSFET), the transistor comprising a silicon substrate, a gate, a drain, and a source; wherein when the silicon substrate and the source are both grounded and a voltage greater than a threshold voltage of the transistor is applied to the gate, a channel is formed between the drain and the source, and the transistor is in one of either an inversion mode or an accumulation mode, the method comprising:

measuring a first unit length gate capacitance when the transistor is in the inversion mode, measuring a second unit length gate capacitance when the gate is grounded, and calculating a first compensation factor according to the first unit length gate capacitance and the second unit length gate capacitance;

measuring a first unit length overlap capacitance between the gate and the source and the drain when the transistor is in the accumulation mode, measuring a second unit length overlap capacitance between the gate and the source and the drain when the gate is grounded, and calculating a second compensation factor according to the first unit length overlap capacitance and the second unit length overlap capacitance;

calculating a third compensation factor according to the first compensation factor and the second compensation factor; and calculating the effective channel length and an overlap length of the gate and the source and the drain according to the first compensation factor, the second compensation factor, and the third compensation factor.

9. The method of claim 8 wherein the first compensation factor is equal to a ratio of the first unit length gate capacitance to the second unit length gate capacitance.

10. The method of claim 8 wherein the second compensation factor is equal to a ratio of the first unit length overlap capacitance to the second unit length overlap capacitance.

11. The method of claim 8 wherein the third compensation factor is equal to a ratio of the second compensation factor to the first compensation factor.

12. The method of claim 8 wherein when the transistor is in the inversion mode, an equivalent unit length capacitance of the transistor is a sum of a unit length gate capacitance, a unit length fringing capacitance of the gate, and a unit length offset capacitance.

13. The method of claim 8 wherein when the transistor is in the accumulation mode, an equivalent unit length capacitance of the transistor is a sum of a unit length overlap capacitance between the gate and the source and the drain, a unit length fringing capacitance of the gate, and a unit length offset capacitance.

14. The method of claim 13 wherein an effective overlap length of the gate and the source and the drain is a ratio of the unit length overlap capacitance to a unit area gate oxide capacitance of the transistor.

15. The method of claim 14 wherein an overlap length of the gate and the source and the drain is a ratio of the effective overlap length to the third compensation factor.

16. The method of claim 15 wherein the effective channel length is equal to a difference between a length of a photomask that is used for manufacturing the transistor, and a predetermined length that is equal to a sum of a polysilicon gate lithography bias and the overlap length of the gate and the source and the drain.

17. The method of claim 16 wherein the polysilicon gate lithography bias is equal to a difference between the length of the photomask and a length of the gate.

* * * * *